(12) United States Patent
Cho et al.

(10) Patent No.: US 10,374,093 B2
(45) Date of Patent: Aug. 6, 2019

(54) METHOD OF FABRICATING A FLEXIBLE SUBSTRATE AND THE FLEXIBLE SUBSTRATE FABRICATED THEREBY

(71) Applicant: Electronics and Telecommunications Research Institute, Daejeon (KR)

(72) Inventors: Doo-Hee Cho, Daejeon (KR); Young Sam Park, Daejeon (KR); Chunwon Byun, Daejeon (KR); Byoung Gon Yu, Chungcheongbuk-do (KR); Jonghee Lee, Daejeon (KR); Hyunkoo Lee, Daejeon (KR); Nam Sung Cho, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/812,231

(22) Filed: Nov. 14, 2017

(65) Prior Publication Data
US 2018/0166583 A1    Jun. 14, 2018

(30) Foreign Application Priority Data

Dec. 8, 2016    (KR) .................. 10-2016-0166988
Apr. 28, 2017   (KR) .................. 10-2017-0055380

(51) Int. Cl.
*H01L 29/76* (2006.01)
*H01L 29/786* (2006.01)
(Continued)

(52) U.S. Cl.
CPC .. *H01L 29/78603* (2013.01); *H01L 21/02002* (2013.01); *H01L 21/02288* (2013.01);
(Continued)

(58) Field of Classification Search
CPC .............. H01L 21/02; H01L 21/02288; H01L 21/02628
See application file for complete search history.

(56) References Cited

U.S. PATENT DOCUMENTS 7,712,676 B2   5/2010  Yukawa et al.
9,142,801 B2   9/2015  Koo et al.
(Continued)

FOREIGN PATENT DOCUMENTS

JP    5809651 B2      11/2015
JP    2016-26407 A    2/2016
(Continued)

OTHER PUBLICATIONS

Ki-Hun Ok et al., "Ultra-thin and smooth transparent electrode for flexible and leakage-free organic light-emitting diodes", Scientific Reports, pp. 1-8, Mar. 31, 2015.

*Primary Examiner* — Samuel A Gebremariam
(74) *Attorney, Agent, or Firm* — Rabin & Berdo, P.C.

(57) ABSTRACT

Embodiments of the inventive concepts provide a method of fabricating a flexible substrate and the flexible substrate fabricated thereby. The method includes printing a gate catalyst pattern on a separation layer, forming a gate plating pattern on the gate catalyst pattern, forming a gate insulating layer on the gate plating pattern, printing a source catalyst pattern and a drain catalyst pattern spaced apart from each other on the gate insulating layer, and forming a source plating pattern and a drain plating pattern on the source catalyst pattern and the drain catalyst pattern, respectively.

7 Claims, 5 Drawing Sheets

(51) Int. Cl.
  *H01L 51/00* (2006.01)
  *H01L 21/288* (2006.01)
  *H01L 21/02* (2006.01)
  *H01L 51/10* (2006.01)
  *H01L 29/423* (2006.01)
  *H01L 21/683* (2006.01)
  *H01L 51/05* (2006.01)
  *H01L 29/66* (2006.01)

(52) U.S. Cl.
  CPC ...... *H01L 21/02628* (2013.01); *H01L 21/288* (2013.01); *H01L 21/683* (2013.01); *H01L 21/6835* (2013.01); *H01L 29/423* (2013.01); *H01L 29/42356* (2013.01); *H01L 29/786* (2013.01); *H01L 29/78636* (2013.01); *H01L 51/0004* (2013.01); *H01L 51/0021* (2013.01); *H01L 51/10* (2013.01); *H01L 21/02532* (2013.01); *H01L 21/02554* (2013.01); *H01L 21/02565* (2013.01); *H01L 29/66765* (2013.01); *H01L 29/66969* (2013.01); *H01L 29/7869* (2013.01); *H01L 29/78651* (2013.01); *H01L 51/0055* (2013.01); *H01L 51/0545* (2013.01); *H01L 2221/6835* (2013.01); *H01L 2221/68318* (2013.01)

(56) References Cited

U.S. PATENT DOCUMENTS

| | | |
|---|---|---|
| 9,445,504 B2 | 9/2016 | Kang et al. |
| 9,510,457 B2 | 11/2016 | Kang et al. |
| 2012/0037907 A1 | 2/2012 | Whiting et al. |
| 2015/0159266 A1 | 6/2015 | Lim et al. |
| 2016/0372356 A1 | 12/2016 | Jinbo et al. |

FOREIGN PATENT DOCUMENTS

| | | |
|---|---|---|
| KR | 10-2011-0122693 A | 11/2011 |
| KR | 10-1161301 B1 | 7/2012 |
| KR | 10-1191865 B1 | 10/2012 |
| KR | 10-1271838 B1 | 6/2013 |

METHOD OF FABRICATING A FLEXIBLE SUBSTRATE AND THE FLEXIBLE SUBSTRATE FABRICATED THEREBY

CROSS-REFERENCE TO RELATED APPLICATION

This U.S. non-provisional patent application claims priority under 35 U.S.C. § 119 to Korean Patent Application Nos. 10-2016-0166988 and 10-2017-0055380, filed on Dec. 8, 2016 and Apr. 28, 2017, in the Korean Intellectual Property Office, the disclosure of which is hereby incorporated by reference in its entirety.

BACKGROUND

Embodiments of the inventive concepts relate to a method of fabricating a flexible substrate and the flexible substrate fabricated thereby and, more particularly, to a method of fabricating a flexible substrate including a thin film transistor and the flexible substrate fabricated thereby.

Various electronic products have been developed with the development of an electronic industry. Recently, flexible electronic products have also been developed. These flexible electronic products may be variously used in portable electronic devices as well as wearable IT devices. A flexible display may include a substrate (e.g., a backplane) including metal interconnection lines and a thin film transistor array. In addition, circuits of many electronic products may include metal interconnection lines and thin film transistor arrays. The electronic circuits including the metal interconnection lines and the thin film transistor arrays may be used in various flexible electronic devices including the flexible display.

In a conventional method of fabricating a flexible substrate, a great amount of waste material and waste water caused by an etching process may be discharged, processes (e.g., deposition, mask-forming and etching processes) may be complicated, and process costs may be expensive. Meanwhile, a conventional method of fabricating a flexible substrate may include a process of forming an electrode by a printing method. However, in this case, metal paste including fine metal particles may be very expensive, and it may be difficult to secure reliability of a pattern. In addition, undesired material may adhere to an area except the pattern.

SUMMARY

Embodiments of the inventive concepts may provide a method of fabricating a flexible substrate, which is capable of reducing a fabrication cost.

Embodiments of the inventive concepts may also provide a flexible substrate with improved reliability.

In an aspect, a method of fabricating a flexible substrate may include forming a separation layer on a carrier substrate, printing a gate catalyst pattern on the separation layer, forming a gate plating pattern on the gate catalyst pattern, forming a gate insulating layer on the gate plating pattern, printing a source catalyst pattern and a drain catalyst pattern spaced apart from each other on the gate insulating layer, forming a source plating pattern and a drain plating pattern on the source catalyst pattern and the drain catalyst pattern, respectively, forming an active pattern covering the source plating pattern, the drain plating pattern, and the gate insulating layer exposed between the source plating pattern and the drain plating pattern, forming a first substrate layer that is flexible and covers an entire top surface of the carrier substrate on which the active pattern is formed, and removing the separation layer and the carrier substrate.

In some embodiments, the forming of the gate insulating layer may include printing and thermally treating a precursor solution including a material of the gate insulating layer.

In some embodiments, the method may further include forming a second substrate layer, which is flexible, on the separation layer before the printing of the gate catalyst pattern.

In some embodiments, the method may further include forming a back-channel protecting layer covering the active pattern before the forming of the first substrate layer.

In some embodiments, the method may further include forming a gas barrier layer covering an entire top surface of the carrier substrate having the active pattern before the forming of the first substrate layer.

In some embodiments, the method may further include forming a protective film covering at least a portion of the first substrate layer after the removing of the separation layer and the carrier substrate.

In some embodiments, the separation layer and the gate plating pattern may be formed of different materials from each other.

In another aspect, a flexible substrate may include a first substrate layer, an active pattern disposed in the first substrate layer, a source electrode and a drain electrode disposed in the first substrate layer and spaced apart from each other by the active pattern, a gate electrode disposed in the first substrate layer and spaced apart from the source electrode and the drain electrode, and a gate insulating layer disposed between the gate electrode and the source electrode and between the gate electrode and the drain electrode. The gate electrode may include a gate catalyst pattern and a gate plating pattern. The source electrode may include a source catalyst pattern and a source plating pattern, and the drain electrode may include a drain catalyst pattern and a drain plating pattern.

In some embodiments, the gate catalyst pattern may have a top surface that is coplanar with a top surface of the first substrate layer.

In some embodiments, top surfaces of the source catalyst pattern and the drain catalyst pattern may be coplanar with a top surface of the active pattern.

In some embodiments, the flexible substrate may further include a second substrate layer disposed on the first substrate layer and being in contact with the gate catalyst pattern.

In some embodiments, the flexible substrate may further include a back-channel protecting layer disposed between the first substrate layer and the active pattern.

In some embodiments, the flexible substrate may further include a gas barrier layer disposed between the first substrate layer and the active pattern, between the first substrate layer and the source electrode, between the first substrate layer and the drain electrode, between the first substrate layer and the gate insulating layer, and between the first substrate layer and the gate electrode.

In some embodiments, the flexible substrate may further include a protective film covering at least a portion of the first substrate layer.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
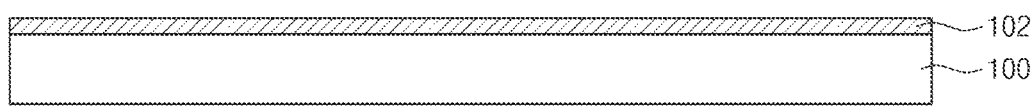
FIGS. 1 to 5 are cross-sectional views illustrating a method of fabricating a flexible substrate, according to some embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a", "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIGS. 1 to 5 are cross-sectional views illustrating a method of fabricating a flexible substrate, according to some embodiments of the inventive concepts.

Referring to FIG. 1, a carrier substrate 100 may be prepared. The carrier substrate 100 may be a solid substrate having a flat surface, such as a glass substrate or a silicon wafer. After cleaning and drying the carrier substrate 100, a separation layer 102 may be formed on the carrier substrate 100. The separation layer 102 may be formed by, for example, a deposition process. In more detail, the separation layer 102 may include at least one of copper, chromium, nickel, titanium, molybdenum, tungsten, manganese, silver, gold, platinum, tin, silicon, or any alloy thereof.

Figure 2:
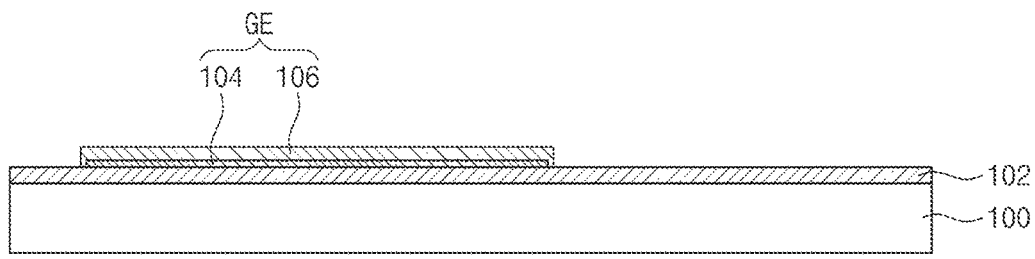

Referring to FIG. 2, a gate catalyst pattern 104 may be printed on the separation layer 102. The gate catalyst pattern 104 may be formed by printing a catalyst solution for promoting a chemical reaction of a subsequent plating process. At this time, a solvent included in the catalyst solution may evaporate, and only a catalyst included in the catalyst solution may remain on the separation layer 102. To plate with copper, a solution including palladium may be used as the catalyst solution. Alternatively, to plate with nickel, a solution including nickel may be used as the catalyst solution. For example, the gate catalyst pattern 104 may include palladium or nickel. The gate catalyst pattern 104 may be formed to expose a portion of the separation layer 102.

Referring continuously to FIG. 2, a plating process such as an electroless plating process may be performed to form a gate plating pattern 106 on the gate catalyst pattern 104. In other words, the carrier substrate 100 having the gate catalyst pattern 104 may be immersed in a plating solution, and thus a metal reduction reaction may be caused on only the gate catalyst pattern 104 to form the gate plating pattern 106. The gate plating pattern 106 may be formed to also cover a sidewall of the gate catalyst pattern 104. The gate plating pattern 106 may be formed of at least one metal selected from a group consisting of copper, nickel, platinum, gold, and chromium. In particular, the gate plating pattern 106 may be formed of a different metal from the separation layer 102. The gate plating pattern 106 and the gate catalyst pattern 104 may constitute a gate electrode GE. The carrier substrate 100 on which the gate electrode GE is formed may be cleaned and dried again. A kind of the material of the separation layer 102 and a kind of the material of the gate electrode GE may be suitably selected to reduce a bonding strength between the separation layer 102 and the gate electrode GE.

Figure 3:
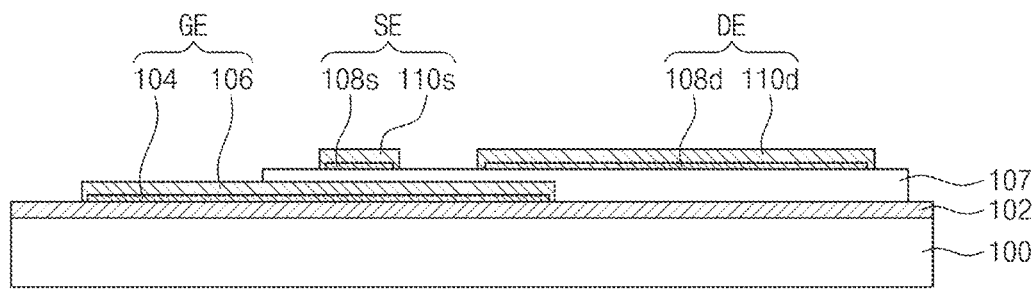

Referring to FIG. 3, a gate insulating layer 107 may be formed to cover the gate electrode GE and the separation layer 102. A precursor solution including a material of the gate insulating layer 107 may be printed and thermally treated to form the gate insulating layer 107. In the thermal treatment process, the precursor may be decomposed into the material of the gate insulating layer 107. For an example, a solution including a precursor (e.g., polysilazane, polysiloxane, or tetraethyl orthosilicate) of silicon oxide ($SiO_2$)

may be printed and dried, and then, the thermal treatment process may be performed on the solution to form the gate insulating layer 107. For another example, a solution including a precursor (e.g., trimethylaluminium) of aluminum oxide ($Al_2O_3$) may be printed and dried, and then, the thermal treatment process may be performed on the solution to form the gate insulating layer 107. For still another example, a solution including a precursor of an oxide having an excellent insulating property (e.g., zirconium oxide ($ZrO_2$) or titanium oxide ($TiO_2$)) may be printed and dried, and then, the thermal treatment process may be performed on the solution to form the gate insulating layer 107. For yet another example, a polymer having an excellent insulating property may be printed and hardened to form the gate insulating layer 107. In some embodiments, the gate insulating layer 107 may be formed of a material having a low bonding strength with the separation layer 102.

Referring continuously to FIG. 3, a source catalyst pattern 108s and a drain catalyst pattern 108d spaced apart from each other may be printed or formed on the gate insulating layer 107. The source catalyst pattern 108s and the drain catalyst pattern 108d may be formed by printing a catalyst solution for promoting a chemical reaction of a subsequent plating process. At this time, a solvent included in the catalyst solution may evaporate, and only a catalyst included in the catalyst solution may remain on the gate insulating layer 107. To plate with copper, a solution including palladium may be used as the catalyst solution. Alternatively, to plate with nickel, a solution including nickel may be used as the catalyst solution. For example, the source catalyst pattern 108s and the drain catalyst pattern 108d may include palladium or nickel.

Referring continuously to FIG. 3, a plating process such as an electroless plating process may be performed to form a source plating pattern 110s and a drain plating pattern 110d on the source catalyst pattern 108s and the drain catalyst pattern 108d, respectively. In other words, the carrier substrate 100 having the source catalyst pattern 108s and the drain catalyst pattern 108d may be immersed in a plating solution, and thus a metal reduction reaction may be caused on only the source catalyst pattern 108s and the drain catalyst pattern 108d to form the source plating pattern 110s and the drain plating pattern 110d. The source plating pattern 110s and the drain plating pattern 110d may be formed to also cover a sidewall of the source catalyst pattern 108s and a sidewall of the drain catalyst pattern 108d, respectively. The source plating pattern 110s and the drain plating pattern 110d may be formed of at least one metal selected from a group consisting of copper, nickel, platinum, gold, and chromium. In particular, the source plating pattern 110s and the drain plating pattern 110d may be formed of a metal having a high bonding strength with the gate insulating layer 107. The source catalyst pattern 108s and the source plating pattern 110s may constitute a source electrode SE. The drain catalyst pattern 108d and the drain plating pattern 110d may constitute a drain electrode DE. The carrier substrate 100 on which the source electrode SE and the drain electrode DE are formed may be cleaned and dried again.

Figure 4:
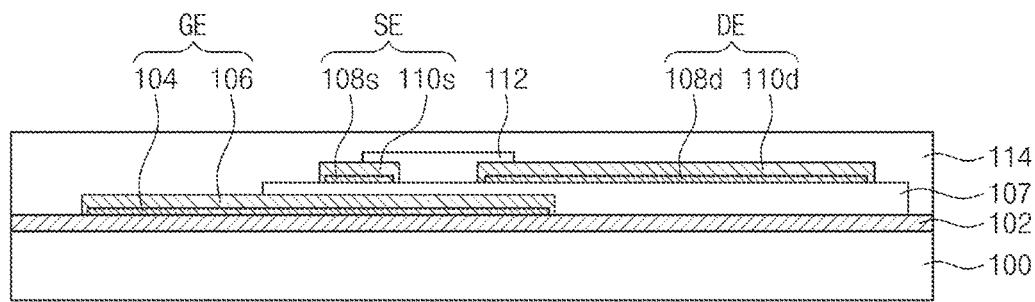

Referring to FIG. 4, an active pattern 112 may be formed to cover the source electrode SE, the drain electrode DE, and the gate insulating layer 107 exposed between the source electrode SE and the drain electrode DE. A precursor solution including a material of the active pattern 112 may be printed and thermally treated to form the active pattern 112. For example, the active pattern 112 may be formed of at least one selected from a group consisting of zinc oxide, tin oxide, zinc tin oxide, aluminum zinc oxide, indium zinc oxide, and silicon. Alternatively, a solution including an organic semiconductor material (e.g., pentacene) may be printed and thermally treated to form the active pattern 112.

Referring continuously to FIG. 4, a substrate layer 114 may be formed on an entire top surface of the carrier substrate 100 on which the active pattern 112 is formed. The substrate layer 114 may be formed of a flexible material. For example, the substrate layer 114 may be formed by applying and hardening a material of a flexible substrate. For example, the material of the flexible substrate may include at least one selected from a group consisting of an acrylate resin, a urethane resin, a polyethylene resin, a polypropylene resin, a polystyrene resin, a polyvinyl chloride resin, a polyimide resin, a polyester resin, and a silicon resin. The substrate layer 114 may include a material having a low bonding strength with the separation layer 102. As a result, a flexible substrate 200 may be formed on the separation layer 102. In other words, the flexible substrate 200 may include the gate electrode GE, the gate insulating layer 107, the source electrode SE, the drain electrode DE, the active pattern 112, and the substrate layer 114.

Figure 5:
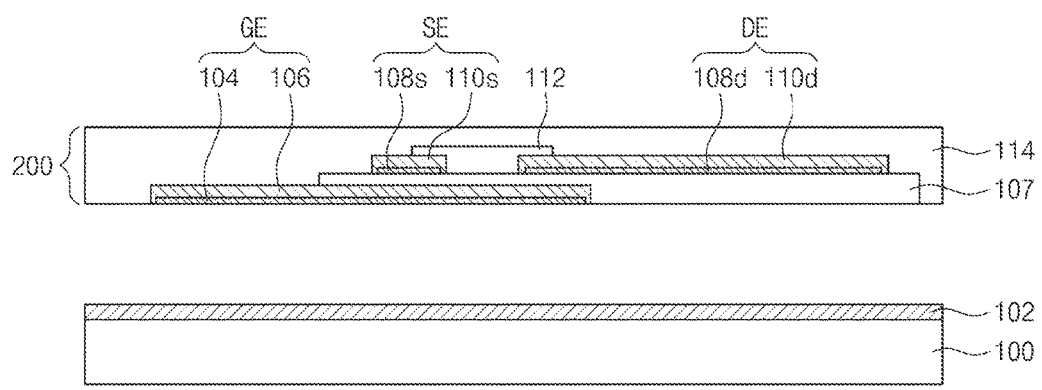

Referring to FIG. 5, the flexible substrate 200 may be separated from the separation layer 102. Thus, the flexible substrate 200 including a thin film transistor array may be completed. The flexible substrate 200 may be separated simply using mechanical force due to the low bonding strength between the separation layer 102 and the gate electrode GE, between the separation layer 102 and the gate insulating layer 107 and between the separation layer 102 and the substrate layer 114. As a result, an expensive and complex laser lift-off process is not used, and thus a fabrication cost of the flexible substrate 200 can be reduced and fabricating processes of the flexible substrate 200 can be simplified.

In the method of fabricating the flexible substrate according to some embodiments of the inventive concepts, an etching process for forming patterns is not used, but the printing methods may be used to form the patterns. Thus, the fabricating method according to the inventive concepts does not require fabrication of an expensive photomask or an expensive photolithography process. In addition, it is possible to solve a problem that a great amount of waste water occurs in an etching process. Moreover, since the catalyst printing processes and the plating processes are used when forming the gate electrode, the source electrode and the drain electrode, expensive metal paste used in a conventional printing process is not needed. Thus, process costs can be reduced.

Furthermore, in the method of fabricating the flexible substrate according to some embodiments of the inventive concepts, all processes of forming the thin film transistor are performed before the substrate layer 114 formed of the polymer is applied. Thus, the material of the substrate layer 114 is not limited to temperatures of the thermal treatment processes among the processes of forming the thin film transistor. As a result, the material of the substrate layer 114 may not require polyimide which is expensive and is stable at a high temperature. In other words, the substrate layer 114 may use various polymer materials which are inexpensive and have low process temperatures. In addition, the temperatures of the thermal treatment processes among the processes of forming the thin film transistor can be increased regardless of the material of the substrate layer 114, and thus electrical characteristics of the thin film transistor can be improved.

FIGS. 6 to 10 are cross-sectional views illustrating flexible substrates according to some embodiments of the inventive concepts.

Figure 6:
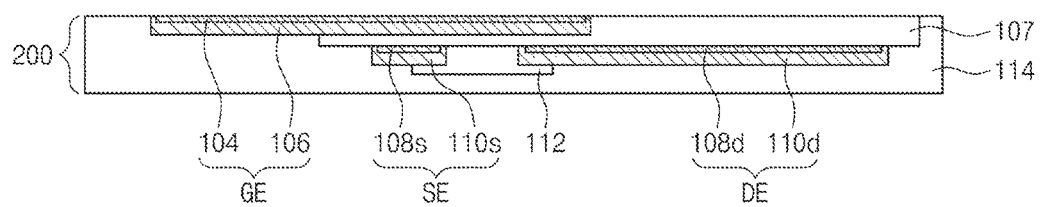
FIGS. 6 to 10 are cross-sectional views illustrating flexible substrates according to some embodiments of the inventive concepts.

Referring to FIG. 6, when the flexible substrate 200 separated in FIG. 5 is turned over, the active pattern 112, the source electrode SE, the drain electrode DE, the gate insulating layer 107 and the gate electrode GE may be disposed in the substrate layer 114. The gate electrode GE may include the gate catalyst pattern 104 and the gate plating pattern 106. The source electrode SE may include the source catalyst pattern 108s and the source plating pattern 110s. The drain electrode DE may include the drain catalyst pattern 108d and the drain plating pattern 110d. The gate catalyst pattern 104 may have a top surface that is coplanar with a top surface of the substrate layer 114. Top surfaces of the source catalyst pattern 108s and the drain catalyst pattern 108d may be coplanar with a top surface of the active pattern 112. A portion of the source electrode SE and the drain electrode DE may be connected to a data line. The gate electrode GE, the source electrode SE, the drain electrode DE and the active pattern 112 may constitute a thin film transistor. The thin film transistor may be provided in plurality, and the plurality of thin film transistors may constitute an array.

Figure 7:
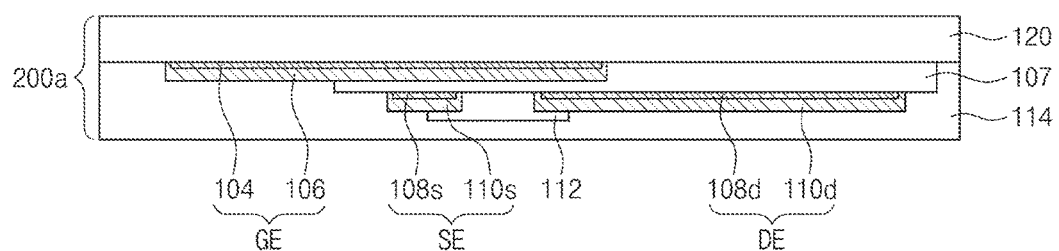

Referring to FIG. 7, a flexible substrate 200a according to the present embodiment may further include an auxiliary substrate layer 120 that is disposed on the substrate layer 114 and is in contact with the gate catalyst pattern 104. The auxiliary substrate layer 120 may be formed on the separation layer 102 before the formation of the gate electrode GE in the step of FIG. 1. A precursor solution including a material of the auxiliary substrate layer 120 may be printed and thermally treated to form the auxiliary substrate layer 120. In the thermal treatment process, the precursor may be decomposed into the material of the auxiliary substrate layer 120. For an example, a solution including a precursor (e.g., polysilazane, polysiloxane, or tetraethyl orthosilicate) of silicon oxide ($SiO_2$) may be printed and dried, and then, the thermal treatment process may be performed on the solution to form the auxiliary substrate layer 120. For another example, a solution including a precursor (e.g., trimethylaluminium) of aluminum oxide ($Al_2O_3$) may be printed and dried, and then, the thermal treatment process may be performed on the solution to form the auxiliary substrate layer 120. For still another example, a solution including a precursor of an oxide having an excellent insulating property (e.g., zirconium oxide ($ZrO_2$) or titanium oxide ($TiO_2$)) may be printed and dried, and then, the thermal treatment process may be performed on the solution to form the auxiliary substrate layer 120. For yet another example, a polymer having an excellent insulating property may be printed and hardened to form the auxiliary substrate layer 120. In some embodiments, the auxiliary substrate layer 120 may be formed of a material having a low bonding strength with the separation layer 102.

Figure 8:
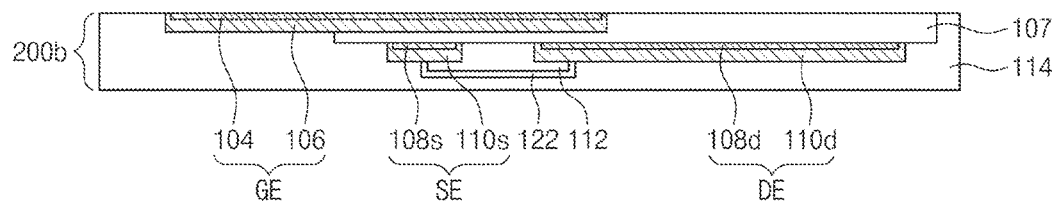

Referring to FIG. 8, a flexible substrate 200b according to the present embodiment may further include a back-channel protecting layer 122 that is disposed between the substrate layer 114 and the active pattern 112. The back-channel protecting layer 122 may be formed before the formation of the substrate layer 114 in the step of FIG. 4. A precursor solution including a material of the back-channel protecting layer 122 may be printed and thermally treated to form the back-channel protecting layer 122. In the thermal treatment process, the precursor may be decomposed into the material of the back-channel protecting layer 122. For an example, a solution including a precursor (e.g., polysilazane, polysiloxane, or tetraethyl orthosilicate) of silicon oxide ($SiO_2$) may be printed and dried, and then, the thermal treatment process may be performed on the solution to form the back-channel protecting layer 122. For another example, a solution including a precursor (e.g., trimethylaluminium) of aluminum oxide ($Al_2O_3$) may be printed and dried, and then, the thermal treatment process may be performed on the solution to form the back-channel protecting layer 122. For still another example, a solution including a precursor of an oxide having an excellent insulating property (e.g., zirconium oxide ($ZrO_2$) or titanium oxide ($TiO_2$)) may be printed and dried, and then, the thermal treatment process may be performed on the solution to form the back-channel protecting layer 122. For yet another example, a polymer having an excellent insulating property may be printed and hardened to form the back-channel protecting layer 122. In some embodiments, the back-channel protecting layer 122 may be formed of a material having a low bonding strength with the separation layer 102.

Figure 9:
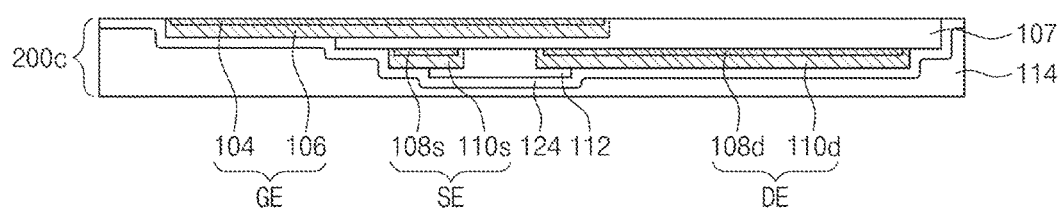

Referring to FIG. 9, a flexible substrate 200c according to the present embodiment may further include a gas barrier layer 124 that is disposed between the substrate layer 114 and the active pattern 112, between the substrate layer 114 and the source electrode SE, between the substrate layer 114 and the drain electrode DE, between the substrate layer 114 and the gate insulating layer 107, and between the substrate layer 114 and the gate electrode GE. The gas barrier layer 124 may be formed of a dense inorganic layer, a dense organic layer, or a dense organic/inorganic composite layer. A precursor solution may be applied, and then, the applied precursor solution may be hardened or thermally treated to form the gas barrier layer 124. Alternatively, the gas barrier layer 124 may be formed by a chemical vapor deposition (CVD) method, an atomic layer deposition (ALD) method, a thermal evaporation method, or a sputtering method. The gas barrier layer 124 may include a single inorganic material thin layer including silicon oxide ($SiO_2$), silicon nitride ($SiN_x$), silicon oxynitride ($SiO_xN_y$), titanium oxide ($TiO_2$), zirconium oxide ($ZrO_2$), or aluminum oxide ($Al_2O_3$). Alternatively, the gas barrier layer 124 may include a single organic material thin layer including polyacrylic, polyurethane, epoxy polymer, polyimide, polypropylene, fluorine-containing polymer, or silicone polymer. In other embodiments, the gas barrier layer 124 may include a multi-layered thin layer which includes one or more inorganic material thin layer and one or more organic material thin layer.

Figure 10:
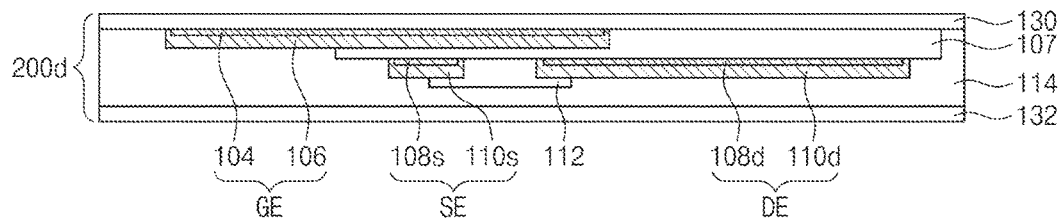

Referring to FIG. 10, a flexible substrate 200d according to the present embodiment may include a first protective film 130 and a second protective film 132 which cover a top surface and a bottom surface of the substrate layer 114, respectively. In FIG. 10, both the top surface and the bottom surface of the substrate layer 114 are covered with the protective films 130 and 132. However, embodiments of the inventive concepts are not limited thereto. In certain embodiments, one of the top surface and the bottom surface of the substrate layer 114 may be covered with the protective film but the other thereof may be exposed. The first protective film 130 and the second protective film 132 may be adhered to the substrate layer 114 to improve mechanical characteristics of the flexible substrate 200d and to protect the flexible substrate 200d.

According to the aforementioned embodiments of the inventive concepts, the flexible substrate having stable thin film transistor characteristics and stable insulating property can be provided with a low cost.

The method of fabricating the flexible substrate according to some embodiments of the inventive concepts may reduce the process costs. The flexible substrate according to some embodiments of the inventive concepts may have the improved reliability.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of fabricating a flexible substrate, the method comprising:
    forming a separation layer on a carrier substrate;
    printing a gate catalyst pattern on the separation layer;
    forming a gate plating pattern on the gate catalyst pattern;
    forming a gate insulating layer on the gate plating pattern;
    printing a source catalyst pattern and a drain catalyst pattern spaced apart from each other on the gate insulating layer;
    forming a source plating pattern and a drain plating pattern on the source catalyst pattern and the drain catalyst pattern, respectively, such that the source plating pattern and the drain plating pattern are spaced apart from each other, exposing the gate insulating layer between the source plating pattern and the drain plating pattern;
    forming an active pattern covering the source plating pattern, the drain plating pattern, and the gate insulating layer exposed between the source plating pattern and the drain plating pattern;
    forming a first substrate layer that is flexible and covers an entire top surface of the carrier substrate on which the active pattern is formed; and
    removing the separation layer and the carrier substrate.

2. The method of claim 1, wherein the forming of the gate insulating layer comprises:
    printing and thermally treating a precursor solution including a material of the gate insulating layer.

3. The method of claim 1, further comprising:
    forming a second substrate layer, which is flexible, on the separation layer before the printing of the gate catalyst pattern.

4. The method of claim 1, further comprising:
    forming a back-channel protecting layer covering the active pattern before the forming of the first substrate layer.

5. The method of claim 1, further comprising:
    forming a gas barrier layer covering an entire top surface of the carrier substrate having the active pattern before the forming of the first substrate layer.

6. The method of claim 1, further comprising:
    forming a protective film covering at least a portion of the first substrate layer after the removing of the separation layer and the carrier substrate.

7. The method of claim 1, wherein the separation layer and the gate plating pattern are formed of different materials from each other.

* * * * *